Figure 2:
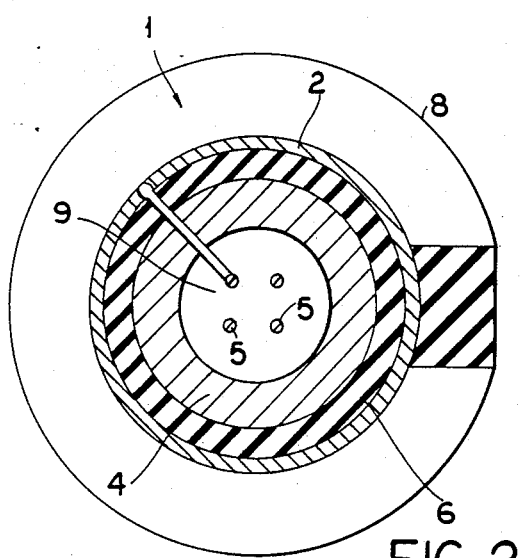

United States Patent [19]

Sorensen

[11] Patent Number: 4,912,415
[45] Date of Patent: Mar. 27, 1990

[54] SONDE OF ELECTRODES ON AN EARTH DRILL FOR MEASURING THE ELECTRIC FORMATION RESISTIVITY IN EARTH STRATA

[76] Inventor: Kurt I. Sørensen, Trigevej 11, Søften, DK-8263 Hinnerup, Denmark

[21] Appl. No.: 198,122

[22] Filed: May 24, 1988

[30] Foreign Application Priority Data

Jun. 4, 1987 [DK] Denmark .................. 2871/87

[51] Int. Cl.⁴ .............. G01V 3/18; E21B 47/00; E21B 49/00; E21B 17/22
[52] U.S. Cl. .................. 324/347; 175/50; 175/323; 324/356; 324/369
[58] Field of Search .......... 324/347, 356, 366, 369; 175/323, 40, 50

[56] References Cited

U.S. PATENT DOCUMENTS

| | | | |
|---|---|---|---|
| 2,809,014 | 10/1957 | Lawrence et al. | 175/323 X |
| 3,085,639 | 4/1963 | Fitch | 175/323 |
| 3,268,801 | 8/1966 | Clements | 324/347 X |
| 4,393,947 | 7/1983 | Lutze et al. | 175/323 |
| 4,494,072 | 1/1985 | Jeter et al. | 324/369 X |
| 4,699,226 | 10/1987 | Muller et al. | 175/323 |

FOREIGN PATENT DOCUMENTS

| | | |
|---|---|---|
| 8310336 | 4/1983 | PCT Int'l Appl. |
| 2130378 | 5/1984 | United Kingdom |
| 2130379 | 5/1984 | United Kingdom |

*Primary Examiner*—Gerard R. Strecker
*Attorney, Agent, or Firm*—Ladas & Parry

[57] ABSTRACT

A sonde has an at least approximately cylindrical drill-stem member, whereby the drill-stem member may be coupled with other drill-stem members into a drill string. A spiral winding is longitudinally about the drill-stem member for conveying drilled out earth up to a surface of the earth when the drill-stem member is rotated into the earth, whereby the drill-stem member is an auger. At least one longitudinal surface portion of the drill-stem member is an electrical insulator that extends inwardly of the surface portion at least part of a radius of the drill-stem member. At least one measuring electrode is embedded in the electrical insulator. A connecting arrangement is in the drill-stem member for connecting the measuring electrode to electric operation and measuring equipment, whereby the auger is also an electrically logging sonde.

18 Claims, 1 Drawing Sheet

SONDE OF ELECTRODES ON AN EARTH DRILL FOR MEASURING THE ELECTRIC FORMATION RESISTIVITY IN EARTH STRATA

The invention relates to a sonde comprising a number of measuring electrodes e.g. metal affixed in interspaced relationship on an earth drill so as to be electrically insulated and serving to determine the electric formation resistivity in the earth strata traversed by the earth drill.

U.S. Pat. No. 3,268,801 decribes a sonde of this kind used in connection with a conventional earth drill having a smooth drill pipe to the bottom end of which a drill bit is affixed. In this case the sonde proper consists of a pipe segment made of an electrically insulating material, the sonde being embedded in the outer surface of the drill pipe, and two measuring electrodes also embedded in the insulating material. The diameter of the drill bit is larger than that of the drill pipe, and consequently an annulus is formed between the pipe and the borehole wall. During the drilling process bore mud is flushed up through this annulus, and the control current used for the measurement consequently has to pass not only through the formations to be identified, but also through the bore mud and the invasion zone, and the same goes for the voltage drops to be measured. This entails errors in measurement which necessarily must be corrected. However, to achieve satisfactory accuracy in measurement in this connection, the electrodes must be spaced relatively far from each other so that the current passage through the formation gets sufficiently long as compared to the passage through the bore mud and the invasion zone.

The vertical resolution obtainable by such electrode spacings suffices for many purposes, e.g. oil and gas drillings, but e.g. water drillings in the top 100 m earth stratum calls for a much finer vertical resolution as in this case it is frequently necessary to be able to identify very thin clay strata separating the water-bearing strata.

Thus, it is the object of the invention to devise a sonde of the kind described in the introduction by which it is possible to achieve more true measuring results with higher vertical resolution than previously known.

The object is achieved in that the sonde according to the invention is characterized in that the drill string of the earth drill comprises a comparatively cylindrical main drill stem being wound by a helical spiral winding for conveying the drilled out earth up to the surface, the drill string wholly or partly in the longitudinal direction and certainly somewhat inwardly from the outer surface consisting of an electrically insulating material in which the measuring electrodes are embedded. This causes the borehole wall to fit so tightly around the drill string as to form an invasion zone of such kind only as to have very little effect on the measuring results. Furthermore, the measuring electrodes are in direct contact with the formations to be identified, and consequently the electrodes can be spaced so closely that even very thin clay strata in e.g. water drillings can be identified with the vertical resolution achieved.

According to the invention the measuring electrodes may be ring-shaped and preferably have the same outer diameter as the main drill stem, and the spiral winding at each of these rings may be made of the said electrically insulating material. Hereby is achieved a particularly simple and inexpensive construction.

In a particularly preferred embodiment of the invention a set of interconnected measuring electrodes may furthermore be affixed to a separate measuring section which e.g. by screw junctions at either end is so coupled to the remainder of the drill string that the spiral winding of the latter proceeds smoothly into the spiral winding of the measuring section. As a consequence, the measuring electrodes may fast and easily be introduced into the drill string during the drilling process proper.

According to the invention the main drill stem may furthermore comprise one or more ducts extending in its longitudinal direction, through which ducts the measuring electrodes via electric wires are connected to an electric operation and measuring equipment appertaining to the sonde and being positioned at the earth surface. Hereby the electric wire connections lie well-protected within the drill string proper, and at the same time the electric operation and measuring equipment can be positioned easily accessibly in earth plane.

Figure 3:
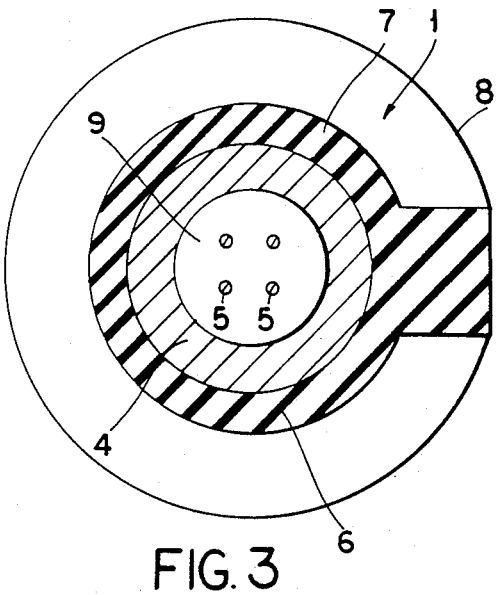
Figure 1:
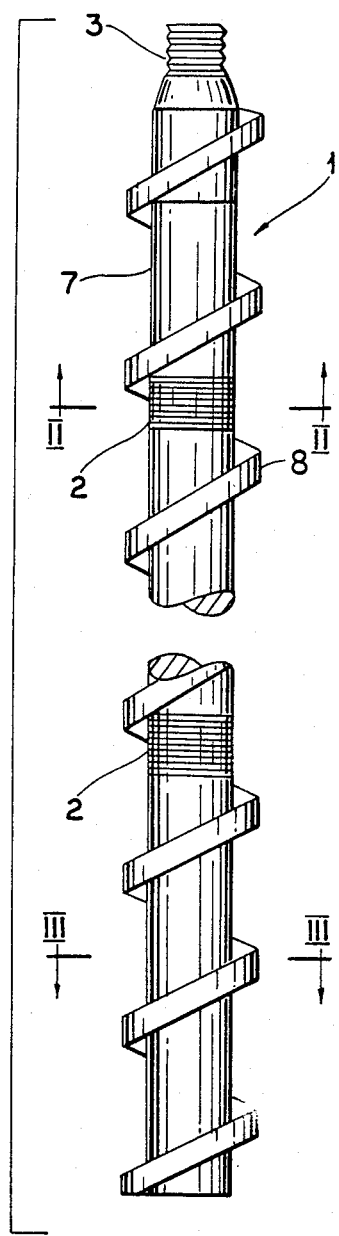

In the following the invention is explained with reference to the drawing in which FIG. 1 is a side view of an earth drill with a sonde according to the invention FIG. 2 is a section along the line II—II in FIG. 1, and FIG. 3 is a section along the line III—III in FIG. 1.

FIG. 1 is an earth drill designated 1, which may be divided into the sections of e.g. 3 m and assembled to form a drill string of 60 m by means of a screw junction 3 having conical thread or other suitable detachable junction.

The earth drill 1 comprises a hollow cylindrical main drill tubing or stem 7, a spiral winding (i.e., screw thread) 8 being helically wound around the main drill stem and a drill bit, not shown, mounted at the bottom end of the drill. The drilling takes place in that the drill is made to rotate by means of a drill rig, not shown, on the earth surface, and as the drill traverses further down into the earth new sections are successively mounted until the desired depth has been reached. During the drilling the spiral winding conveys the drilled out earth as a smooth continuous flow up to the earth surface, the earth simultaneously closing tightly around the drill due to the natural earth pressure.

The entire earth drill may be made of an electrically insulating material, but in the preferred embodiment most of the length of the drill is made wholly of steel. Conversely, those drill sections which serve as measuring sections comprise (FIG. 3) an inner tubing 4 of steel surrounded by an outer tubing 6 of a suitable electrically insulating material, e.g., polyurethane. The spiral winding 8 along such measuring section can be of the same material as the tubing 6. In one embodiment, the measuring section can have a length of, e.g., 1.5 m, and the tubing 6 a wall thickness of, e.g., 5 mm. A number of measuring electrodes 2 is with suitable axial spacings embedded (FIG. 2.) in the outer wall of the tubing 6.

In the embodiment shown these measuring electrodes are thin metal rings 2 having a material thickness of e.g. 2 mm. In all, there are four of these rings 2 which via electric wires 5 drawn through a center hole 9 in the drill stem 7 are connected to a current source and a measuring equipment, not shown, positioned in earth plane Measurement is performed by transmitting a current having a current intensity of approx. 1–100 milliamperes through the earth from e.g. the top to the bottom electrode for about 1 sec. and after about 1 sec. repeating the process in reversed order. The measuring results are obtained by recording during this process the voltage drop in the earth formation between the two electrodes in the middle.

By means of reference values the measuring results can then be used for identifying the earth formations in question, and by measuring typically for each 5 cm the drill traverses down into the earth, a complete picture of the earth formations around the borehole may be drawn.

As mentioned above, the invasion zone formed when using the sonde according to the invention affects the measuring results only negligently, and the recorded values consequently get more true and the vertical resolution at the same time far finer than previously known, as the electrodes as also mentioned above can be positioned with relatively close spacings.

Several measuring sections may be mounted in the same drill string, each section having different electrode spacings. Hereby an even more varied picture of the earth formations may be drawn, as these in one and the same drilling process can be identified in various horizontal depths from the earth drill, e.g. 10 cm with one measuring section and 30 cm with another measuring section.

In the above embodiment the measuring section had four electrodes, however, according to the invention nothing prevents the said section from having a different number of electrodes.

I claim:

1. A sonde, comprising:
   an at least approximately cylindrical drill-stem member, whereby the drill-stem member may be coupled with other drill-stem members into a drill string;
   a spiral winding extending longitudinally about the drill-stem member for conveying drilled out earth up to a surface of the earth when the drill-stem member is rotated into the earth, whereby the drill-stem member is an auger;
   at least one longitudinal surface portion of the drill-stem member about which the spiral winding extends being an electrical insulator that extends inwardly of the surface portion at least part of a radius of the drill-stem member;
   at least one measuring electrode embedded in the electrical insulator; and
   connecting means in the drill-stem member for connecting the measuring electrode to electric operation and measuring equipment, whereby the auger is also an electrically logging sonde.

2. The sonde of claim 1, wherein the electrical insulator and measuring electrode are rings about the drill-stem member, a portion of the spiral winding is at the measuring electrode, and the portion of the spiral winding at the measuring electrode is another electrical insulator.

3. The sonde of claim 2, wherein the electrical insulator surface portion of the drill-stem member and the measuring electrode have an outer diameter the same as an outer diameter of all other portions of the drill-stem member.

4. The sonde of claim 1, and further comprising coupling means on one end of the drill-stem member for coupling the latter to another drill-stem member as the drill string, the coupling means having means for coupling the drill-stem members such that the spiral windings thereof are smoothly continuous.

5. The sonde of claim 2, and further comprising coupling means on one end of the drill-stem member for coupling the latter to another drill-stem member as the drill string, the coupling means having means for coupling the drill-stem members such that the spiral windings thereof are smoothly continuous.

6. The sonde of claim 3, and further comprising coupling means on one end of the drill-stem member for coupling the latter to another drill-stem member as the drill string, the coupling means having means for coupling the drill-stem members such that the spiral windings thereof are smoothly continuous.

7. The sonde of claim 4, wherein the coupling means comprises a screw thread.

8. The sonde of claim 5, wherein the coupling means comprises a screw thread.

9. The sonde of claim 6, wherein the coupling means comprises a screw. thread.

10. The sonde of claim 1, wherein the connecting means comprises at least one duct longitudinally through the drill-stem member at least from the electrode to one end thereof and at least one wire from the electrode through the duct to the one end for connection to the electric operation and measuring equipment, whereby the latter may be on the surface of the earth.

11. The sonde of claim 2, wherein the connecting means comprises at least one duct longitudinally through the drill-stem member at least from the electrode to one end thereof and at least one wire from the electrode through the duct to the one end for connection to the electric operation and measuring equipment, whereby the latter may be on the surface of the earth.

12. The sonde of claim 3, wherein the connecting means comprises at least one duct longitudinally through the drill-stem member at least from the electrode to one end thereof and at least one wire from the electrode through the duct to the one end for connection to the electric operation and measuring equipment, whereby the latter may be on the surface of the earth.

13. The sonde of claim 4, wherein the connecting means comprises at least one duct longitudinally through the drill-stem member at least from the electrode to one and thereof and at least one wire from the electrode through the duct to the one end for connection to the electric operation and measuring equipment, whereby the latter may be on the surface of the earth.

14. The sonde of claim 5, wherein the connecting means comprises at least one duct longitudinally through the drill-stem member at least from the electrode to one end thereof and at least one wire from the electrode through the duct to the one end for connection to the electric operation and measuring equipment, whereby the latter may be on the surface of the earth.

15. The sonde of claim 6, wherein the connecting means comprises at least one duct longitudinally through the drill-stem member at least from the electrode to one end thereof and at least one wire from the electrode through the duct to the one end for connection to the electric operation and measuring equipment, whereby the latter may be on the surface of the earth.

16. The sonde of claim 7, wherein the connecting means comprises at least one duct longitudinally through the drill-stem member at least from the electrode to one end thereof and at least one wire from the electrode through the duct to the one end for connection to the electric operation and measuring equipment, whereby the latter may be on the surface of the earth.

17. The sonde of claim 8, wherein the connecting means comprises at least one duct longitudinally through the drill-stem member at least from the electrode to one end thereof and at least one wire from the electrode through the duct to the one end for connection to the electric operation and measuring equipment, whereby the latter may be on the surface of the earth.

18. The sonde of claim 9, wherein the connecting means comprises at least one duct longitudinally through the drill-stem member at least from the electrode to one end thereof and at least one wire from the electrode through the duct to the one end for connection to the electric operation and measuring equipment, whereby the latter may be on the surface of the earth.

* * * * *